(12) United States Patent
Daubenspeck et al.

(10) Patent No.: US 8,212,357 B2
(45) Date of Patent: Jul. 3, 2012

(54) COMBINATION VIA AND PAD STRUCTURE FOR IMPROVED SOLDER BUMP ELECTROMIGRATION CHARACTERISTICS

(75) Inventors: Timothy H. Daubenspeck, Colchester, VT (US); Jeffrey P. Gambino, Westford, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 477 days.

(21) Appl. No.: 12/188,235

(22) Filed: Aug. 8, 2008

(65) Prior Publication Data

US 2010/0032835 A1 Feb. 11, 2010

(51) Int. Cl.
*H01L 23/488* (2006.01)
*H01L 21/44* (2006.01)
(52) U.S. Cl. ........ 257/738; 257/737; 257/773; 257/781; 257/786; 257/E23.023; 438/612; 438/622
(58) Field of Classification Search .................. 257/738, 257/E23.023, E23.032, 737, 773, 781, 786; 438/612, 622
See application file for complete search history.

(56) References Cited

U.S. PATENT DOCUMENTS

| | | | |
|---|---|---|---|
| 6,521,996 B1* | 2/2003 | Seshan | 257/737 |
| 7,034,402 B1* | 4/2006 | Seshan | 257/781 |
| 7,208,843 B2 | 4/2007 | Richling et al. | |
| 2001/0008311 A1* | 7/2001 | Harada et al. | 257/758 |
| 2001/0010408 A1* | 8/2001 | Ker et al. | 257/781 |
| 2005/0233570 A1* | 10/2005 | Bohr et al. | 438/613 |
| 2006/0234423 A1 | 10/2006 | Thomas et al. | |
| 2007/0085204 A1* | 4/2007 | Korec et al. | 257/737 |
| 2007/0278675 A1* | 12/2007 | Okada | 257/738 |
| 2008/0111250 A1* | 5/2008 | Melville et al. | 257/782 |
| 2009/0015285 A1* | 1/2009 | Farooq et al. | 324/763 |
| 2009/0140423 A1* | 6/2009 | Belanger et al. | 257/738 |

* cited by examiner

*Primary Examiner* — Eugene Lee
*Assistant Examiner* — Peniel M Gumedzoe
(74) *Attorney, Agent, or Firm* — Richard Kotulak; Roberts Mlotkowski Safran & Cole, P.C.

(57) ABSTRACT

The invention generally relates to semiconductor devices, and more particularly to structures and methods for enhancing electromigration (EM) performance in solder bumps and related structures. A semiconductor structure includes a wire comprising first and second wire segments, a pad formed over the wire, and a ball limiting metallization (BLM) layer formed over the pad. The semiconductor structure also includes a solder bump formed over the BLM layer, a terminal via formed over the BLM layer, and at least one peripheral via formed between the second wire segment and the pad. The first and second wire segments are discrete wire segments.

22 Claims, 10 Drawing Sheets

COMBINATION VIA AND PAD STRUCTURE FOR IMPROVED SOLDER BUMP ELECTROMIGRATION CHARACTERISTICS

FIELD OF THE INVENTION

The invention generally relates to semiconductor devices, and more particularly to structures and methods for enhancing electromigration (EM) performance in solder bumps and related structures.

BACKGROUND

Integrated circuits conventionally comprise a substrate, semiconductor devices, and wiring (e.g., metallization) layers formed above the semiconductor devices. The wiring layers comprise various interconnects that provide electrical connections between the devices and external connections. Solder projections (also referred to as solder bumps, bumps, or solder balls) are commonly utilized to provide a connection between the last (e.g., top) wiring level of a semiconductor device and another device. A common type of solder bump is the controlled collapse chip connection (C4) solder bump.

Current generation chip products make use of an aluminum last metal pad which connects to a C4 solder bump. There are two primary variations on this structure. On the one hand, in structures used specifically for base silicon on insulator (SOI) technologies, the aluminum level comprises only a pad (i.e., no wires or other structures), the pad making a connection directly down through a large, centrally located via opening to the last metal wiring level (e.g., wire, interconnect, etc.). On the other hand, in conventional structures used for foundry and application specific integrated circuit (ASIC) technologies, the aluminum level comprises a combination pad and aluminum last-metal wiring level. The pad in the latter case makes contact to the last metal wiring level through multiple small vias, which are offset in location with respect to the pad center (e.g., by about 10 μm). However, in both instances, the pad contacts the ball limiting metallization (BLM) layer (also known as the under bump metallization, i.e., UBM) in a single large contact area.

As dimensions of features (e.g., pads, wires, interconnects, vias, etc.) continue to shrink to create smaller devices, the maximum allowable current density decreases rapidly due to electromigration (EM) effects. Electromigration is a well known phenomena in which, generally speaking, atoms of a metal feature are displaced due to the electrical current passing through the feature. The migration of atoms can result in voids in the feature, which can increase electrical resistance or cause failure of the feature, both of which negatively impact reliability of the integrated circuit.

For current technologies, C4 solder bump electromigration performance is approaching a performance limit, especially as the technologies migrate to lead-free C4 solder structures that are more susceptible to electromigration. In conventional C4 solder bump contact designs, the electrical current can pool (e.g., become crowded), which results in a localized increase in current density. For example, in the known pad arrangements discussed above, current tends to pool at a small area of the leading edge of the connection between the wire, pad, BLM, and solder bump. This crowding of current associated with C4 pad and/or via structures often results in electromigration void formation, which can lead to increased resistance and ultimately failure of the device.

Accordingly, there exists a need in the art to overcome the deficiencies and limitations described hereinabove.

SUMMARY

In a first aspect of the invention, there is a semiconductor structure comprising a wire comprising first and second wire segments, a pad formed over the wire, and a ball limiting metallization (BLM) layer formed over the pad. The semiconductor structure includes a solder bump formed over the BLM layer, a terminal via formed over the BLM layer, and at least one peripheral via formed between the second wire segment and the pad. The first and second wire segments are discrete wire segments.

In another aspect of the invention, there is a semiconductor structure comprising a plurality of stacks between an upper wiring level and a solder bump, each one of the plurality of stacks comprising a wire segment, a pad segment, and a terminal via. Each one of the plurality of stacks constitutes a discrete electrically conductive path between the upper wiring level and the solder bump to reduce current density.

In another aspect of the invention, there is a method for forming a semiconductor device comprising forming a first wire segment and a second wire segment in a wiring level, wherein the first and second wire segments are discrete wire segments. The method also includes forming at least one peripheral via over the second wire segment, forming a pad contacting the first wire segment and the at least one peripheral via, and forming a ball limiting metallization (BLM) layer, a terminal via, a final via, and a solder bump in electrical communication with the pad.

In another aspect of the invention, there is a method for forming a semiconductor structure comprising: forming at least two discrete wire segments in a wiring level; forming a first dielectric film over the wire segments and the wiring level; forming peripheral vias in the first dielectric film; forming a second dielectric film on the first dielectric film; and forming at least two discrete pad segments in the second dielectric film. The method also includes: forming a passivation layer over the second dielectric film; forming at least two terminal via openings in the passivation layer; forming a ball limiting metallization (BLM) on exposed surfaces; and forming a solder bump on the BLM layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to semiconductor devices, and more particularly to structures and methods for enhancing electromigration (EM) performance in solder bumps and related structures. In embodiments, the last metal level (e.g., upper wiring level) of a chip is segmented, and plural distinct vias are provided between the wiring segments and a solder bump. In this manner, electrical current flowing between a solder bump and the wiring segments is dispersed amongst several locations. This reduces localized current density, which improves the electromigration performance of the structure. Accordingly, aspects of the invention extend the useful lifetime of devices that utilize solder bumps.

Figure 1:
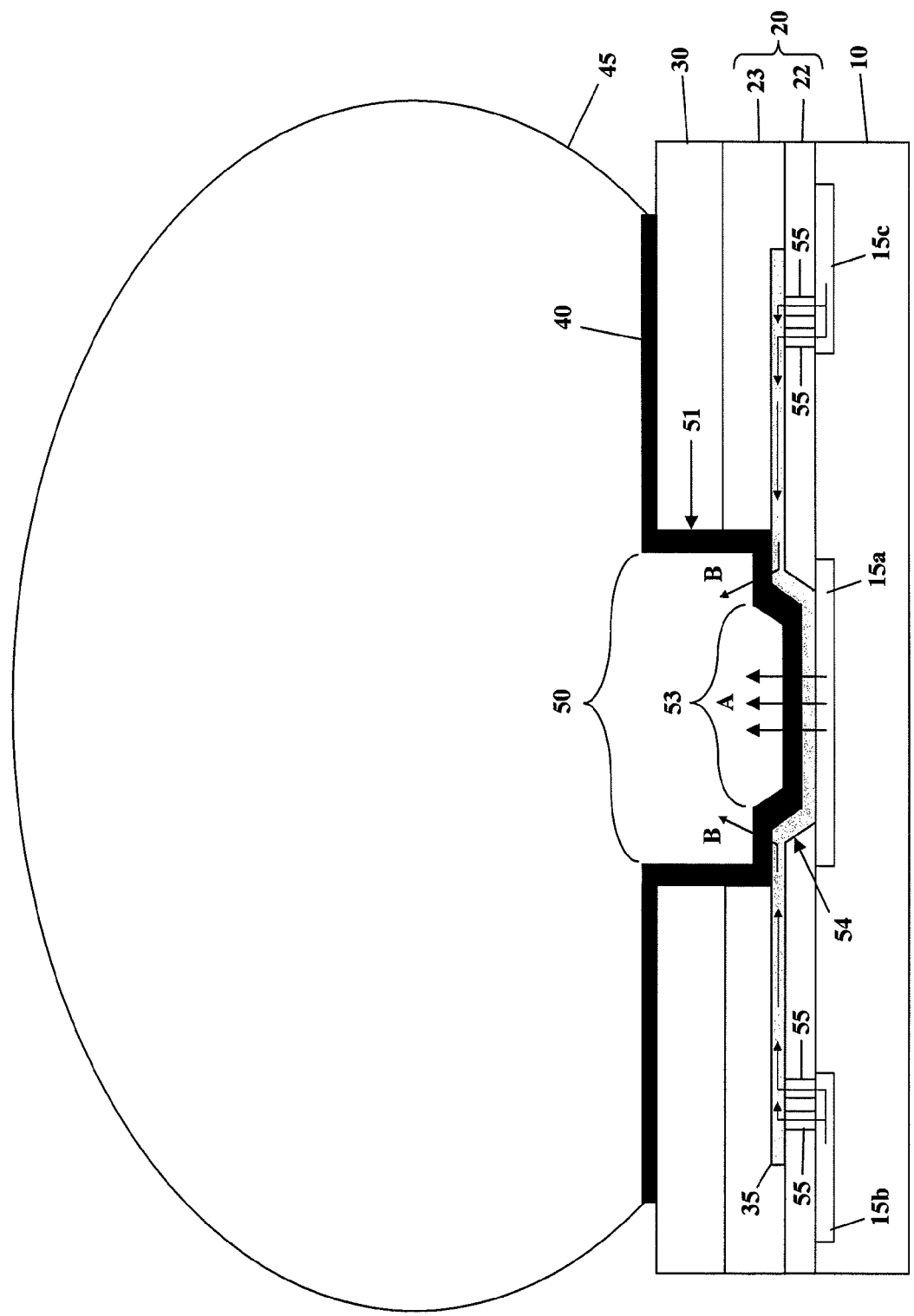
FIGS. 1-7 show semiconductor structures according to aspects of the invention.

FIG. 1 shows a cross sectional view of an exemplary semiconductor structure according to aspects of the invention. In embodiments, layer 10 is an upper level (e.g., last level) wiring layer of an integrated circuit chip. Layer 10 may be composed of, for example, dielectric material (e.g., doped silicon carbide, silicon nitride, low-k materials, etc.). Wires 15a, 15b, 15c are disposed in layer 10, and represent back end of line (BEOL) wiring of the chip. Wires 15a, 15b, 15c may be composed of any suitable conducting material, including, but not limited to: copper, copper alloy, aluminum, etc. The wires 15a, 15b, 15c represent discrete segments of a single line within the chip in the sense that all of the wires 15a, 15b, 15c carry substantially the same signal (e.g., have substantially the same electrical potential). Although three wires 15a, 15b, 15c are shown, any number of wires may be used within the scope of the invention.

Formed over the layer 10 and wires 15a, 15b, 15c is capping layer 20 of hard dielectric. In embodiments, the capping layer 20 comprises two films 22, 23, the lower film 22 being composed of an oxide based material, and the upper film 23 being composed of a nitride based material. However, the invention is not limited to these materials, and any suitable capping material(s) may be used. Passivation layer 30 is formed over the capping layer 20. In embodiments, passivation layer 30 comprises photosensitive polyimide (PSPI), although the invention is not limited to this material, and any suitable material may be used.

Still referring to FIG. 1, the semiconductor structure further includes pad 35 and ball limiting metallization (BLM) layer 40, which together provide electrical connection between a solder bump 45 and wires 15a, 15b, 15c. In embodiments, the pad 35 is formed in a terminal via opening 54 formed in the lower film 22 and upper film 23 of the capping layer 20. Moreover, the BLM 40 is arranged along exposed portions of a final via opening 51 formed in the passivation layer 30 and the upper film 23 of the capping layer 20. In embodiments, the pad 35 is composed of aluminum, the BLM 40 is comprises at least one of tungsten, copper, and nickel, and the solder bump 45 comprises a conventional lead free composition (e.g., tin, copper, etc.). However, the invention is not limited to these materials, and any suitable materials may be used for the pad 35, BLM 40, and solder bump 45.

In embodiments, a final via 50 is formed in a final via opening 51 in the passivation layer 30 and capping layer 20, and a terminal via 53 is formed in a terminal via opening 54 in the capping layer 20. The BLM 40 lies atop the upper surface of the passivation layer 30, lines the walls of the final via opening 51 in the passivation layer 30 and capping layer 20, and contacts an upper surface of the pad 35 in the area of the terminal via opening 54. Additionally, in embodiments, the pad 35 lines the walls of the capping layer 20 in the terminal via opening 54.

According to aspects of the invention, the pad 35 is in contacts with the wire 15a and the BLM 40 in a generally centralized location below the final via 50 and terminal via 53. In this manner, the pad 35 provides a first path for current to flow between wire 15a and the solder bump 45, represented generally by arrows "A".

Additionally, in embodiments, peripheral vias 55 are formed between outer portions of the pad 35 and wires 15b, 15c. The peripheral vias 55 may be formed in the capping layer 20, and may be composed of the same material as the pad 35 (e.g., aluminum), although other conductive materials may be used within the scope of the invention. The peripheral vias 55 provide an alternate path (or paths) for current to flow between the wires 15b, 15c and the solder bump 45, represented generally by arrows "B". By providing plural, discretized paths (e.g., "A" and "B") for current to flow between the wires 15a, 15b, 15c and the solder bump 45, crowding of the current at localized areas of the solder bump is minimized. In this manner, implementations of the invention cause current to emerge into the BLM 40 at dispersed locations, which reduces localized current density and improves electromigration performance.

Figure 2:
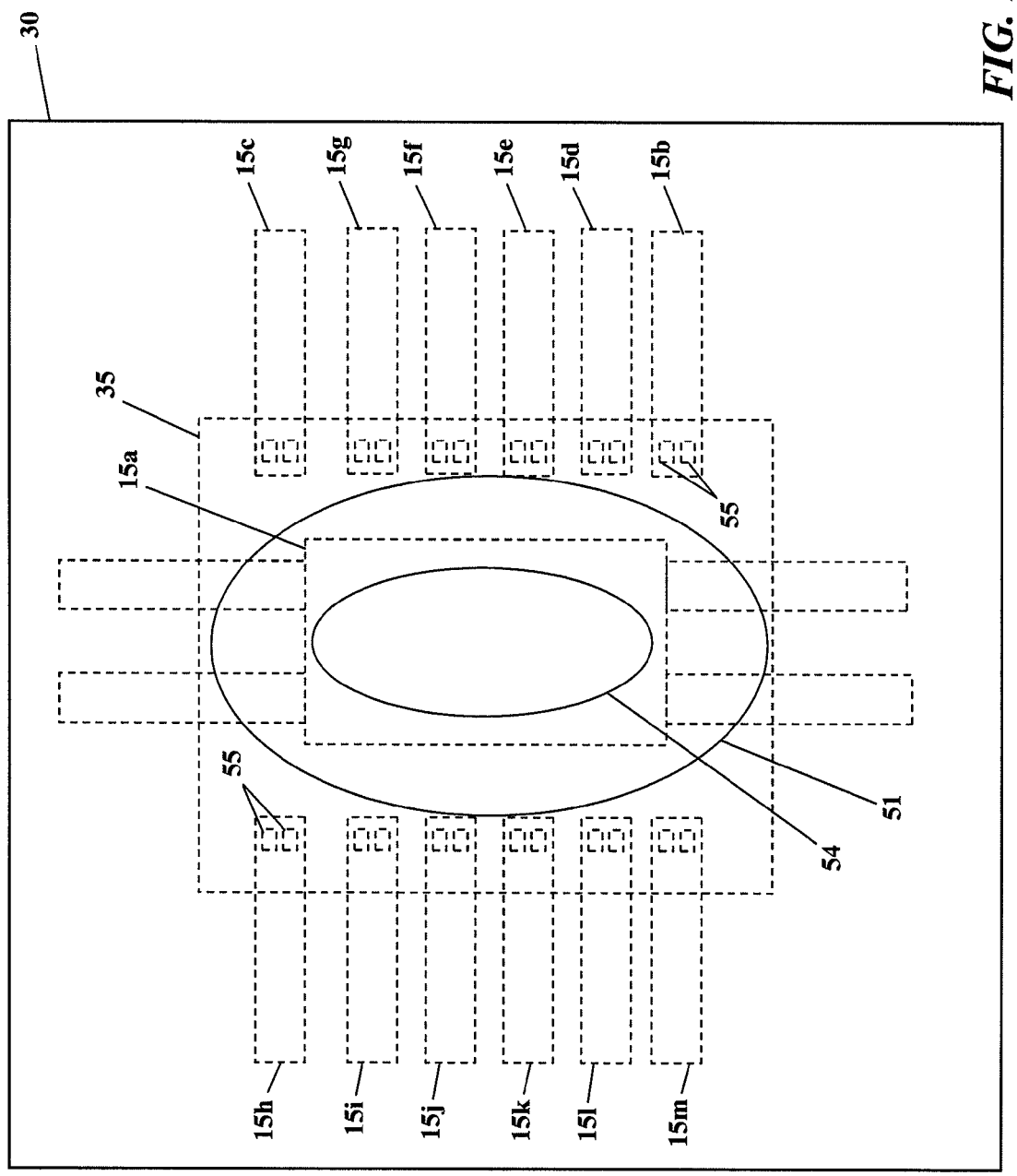

FIG. 2 shows a top down view of a semiconductor structure according to aspects of the invention, in which like numerals represent similar features. As seen in the schematic view, in embodiments, the final via opening 51 is formed generally centrally within the PSPI 30, and the terminal via opening 54 is formed generally centrally within the confines of the final via opening 51. This helps reduce current "crowding" at the edges of the final via, thereby resulting in decreased current density at these locations. As such, the current density in any one area is reduced proportionally to the number of separate paths. Accordingly, electromigration performance of the chip is improved. The final via opening 51 and terminal via opening 54 are shown as oval shapes, but any shape may be used within the scope of the invention.

Still referring to FIG. 2, the pad 35 is sized and shaped to provide contact with a central wire 15a and also with peripheral vias 55 of peripheral wires 15b, 15c, . . . , 15m. Although twelve peripheral wires 15b-m are shown, any number may be used with implementations of the invention. Moreover, although each peripheral wire is shown with two rectangular peripheral vias 55, any number of peripheral vias 55 having any desired shape may be used with each peripheral wire. Although the BLM 40 and solder ball 45 are not shown, it is understood that theses feature may be included in the structure shown in FIG. 2.

Figure 3:
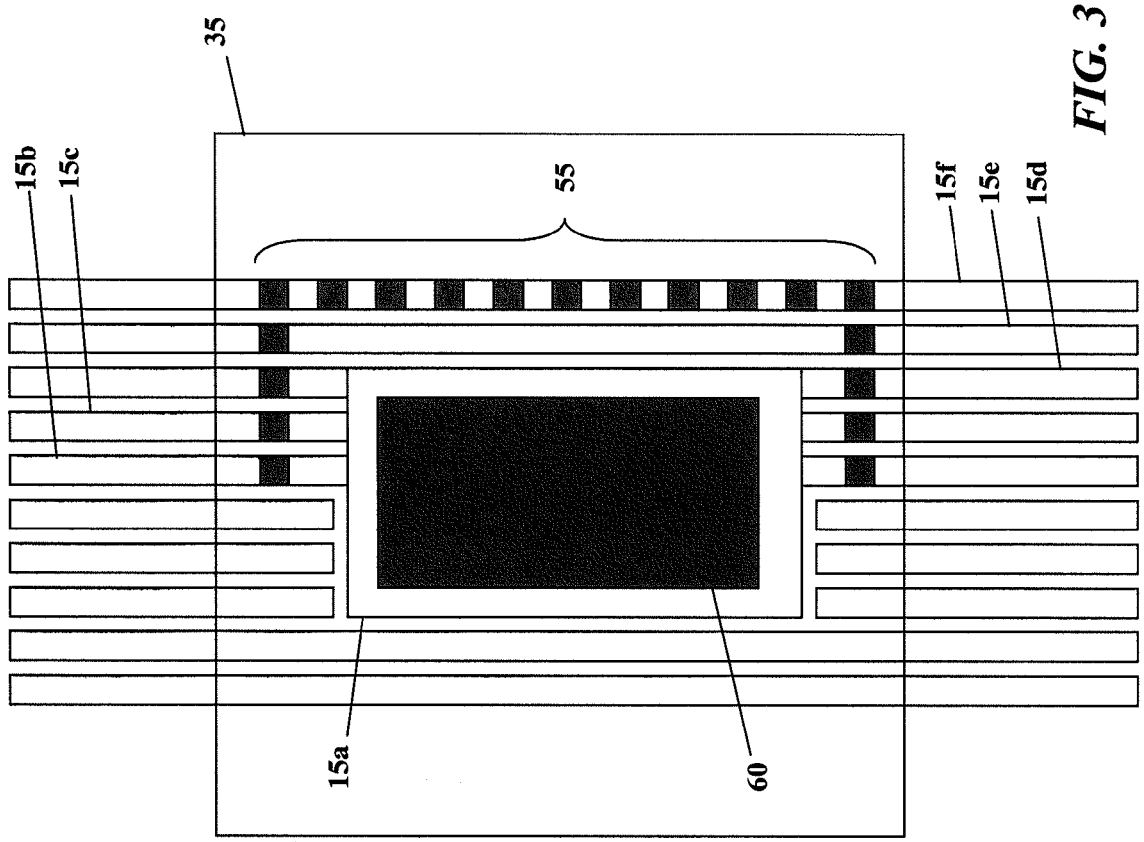

FIG. 3 shows a top-down view of an arrangement of features according to aspects of the invention. Such an arrangement may be used, for example, as a power rail configuration in chip. In FIG. 3, a single relatively large via 60 is formed beneath the pad 35 to provide contact with first wire 15a. Smaller peripheral vias 55 extend between discrete locations of the pad 35 and wires 15b-f. Although not shown, it is understood that the structure of FIG. 3 may include other features, such as, for example, PSPI 30, BLM 40, solder bump 45, etc.

Figure 4:
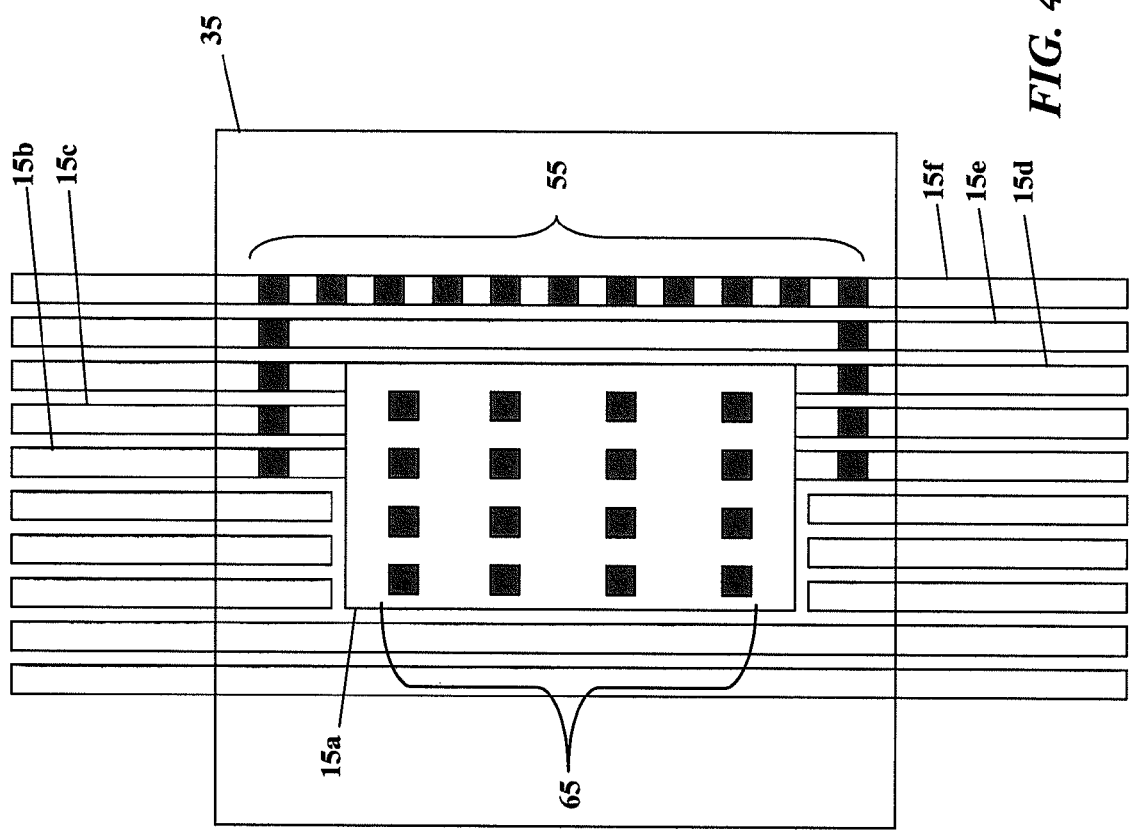

FIG. 4 shows a variation of the structure shown in FIG. 3, in which like numerals represent similar features. In FIG. 4, the single relatively large via (e.g., 60 of FIG. 3) is replaced with an array 65 of smaller vias arranged beneath the pad 35 and above the wire 15a. In this manner, even more paths are provided for current to flow between the circuit of the chip and the solder bump. The invention is not limited to the number of vias shown in array 65, but rather, any suitable number may be used.

Figure 5:
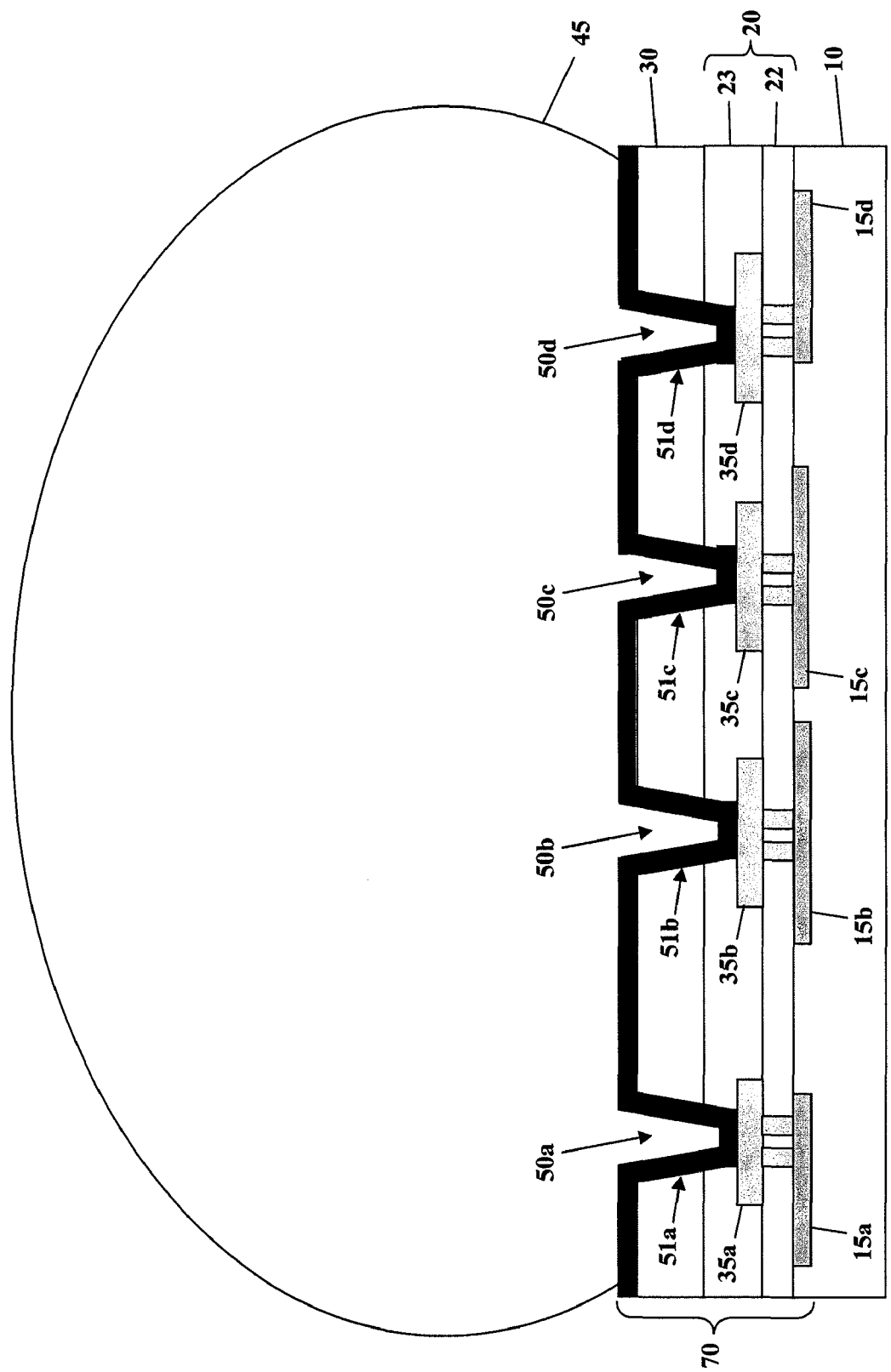

FIG. 5 shows a semiconductor structure according to further aspects of the invention. Similar to the structure of FIG. 1, the structure in FIG. 5 comprises a dielectric layer 10, capping layer 20, PSPI layer 30, BLM 40, and solder bump 45. However, instead of having a single, centrally located final via and terminal via, the structure of FIG. 5 includes plural, discretized final vias 50a-d formed in plural final via openings 51a-d in the PSPI layer 30 and capping layer 20. Moreover, the pad is segmented into plural discrete pad portions 35a, 35b, 35c, 35d. Each respective pad portion 35a-d is connected to a respective underlying wire portion 15a-d by at least one peripheral via 55. In this manner, a plurality of stacks 70 are provided, each stack 70 comprising a wire portion (e.g., 15a-d), at least one peripheral via (e.g., 55), a pad portion (e.g., 35a-d), and a final via (e.g., 50a-d).

Figure 6:
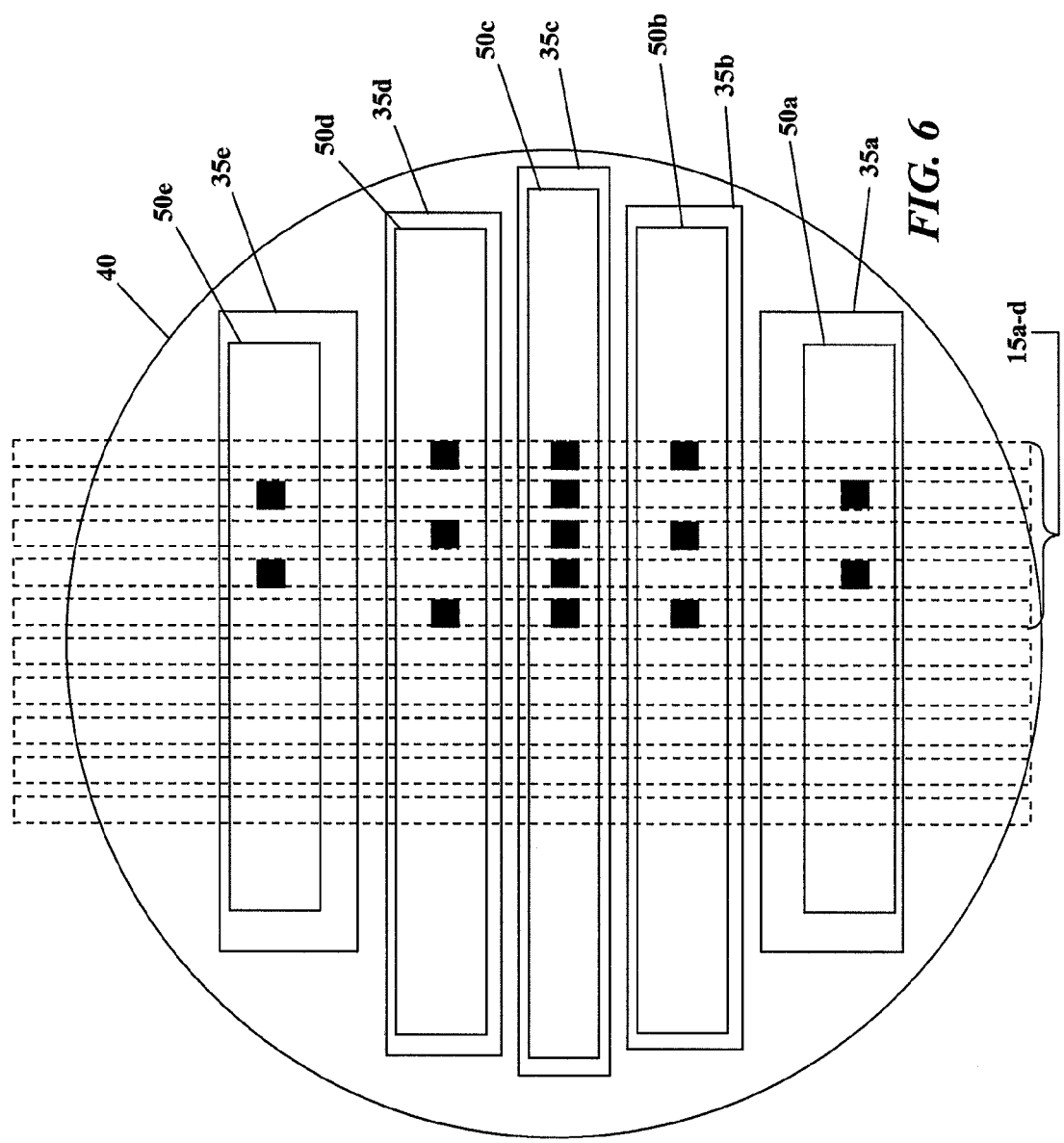

FIG. 6 shows a top-down schematic view of a structure according to aspects of the invention, in which like reference numbers represent similar features. For example, the structure depicted in FIG. 6 comprises a BLM layer 40, plural discrete pad segments 35a-e, plural segmented final vias 50a-e, and wires 15a-e. Peripheral vias 55 extend between the wires 15a-e and the pad segments 35a-e. Any desired arrangement of vias 55 may be used, and as such the invention not being limited to the number and layout shown in FIG. 6. Although not shown, it is understood that the structure of FIG. 6 may include other features, such as, for example, PSPI 30, solder bump 45, etc.

Figure 7:
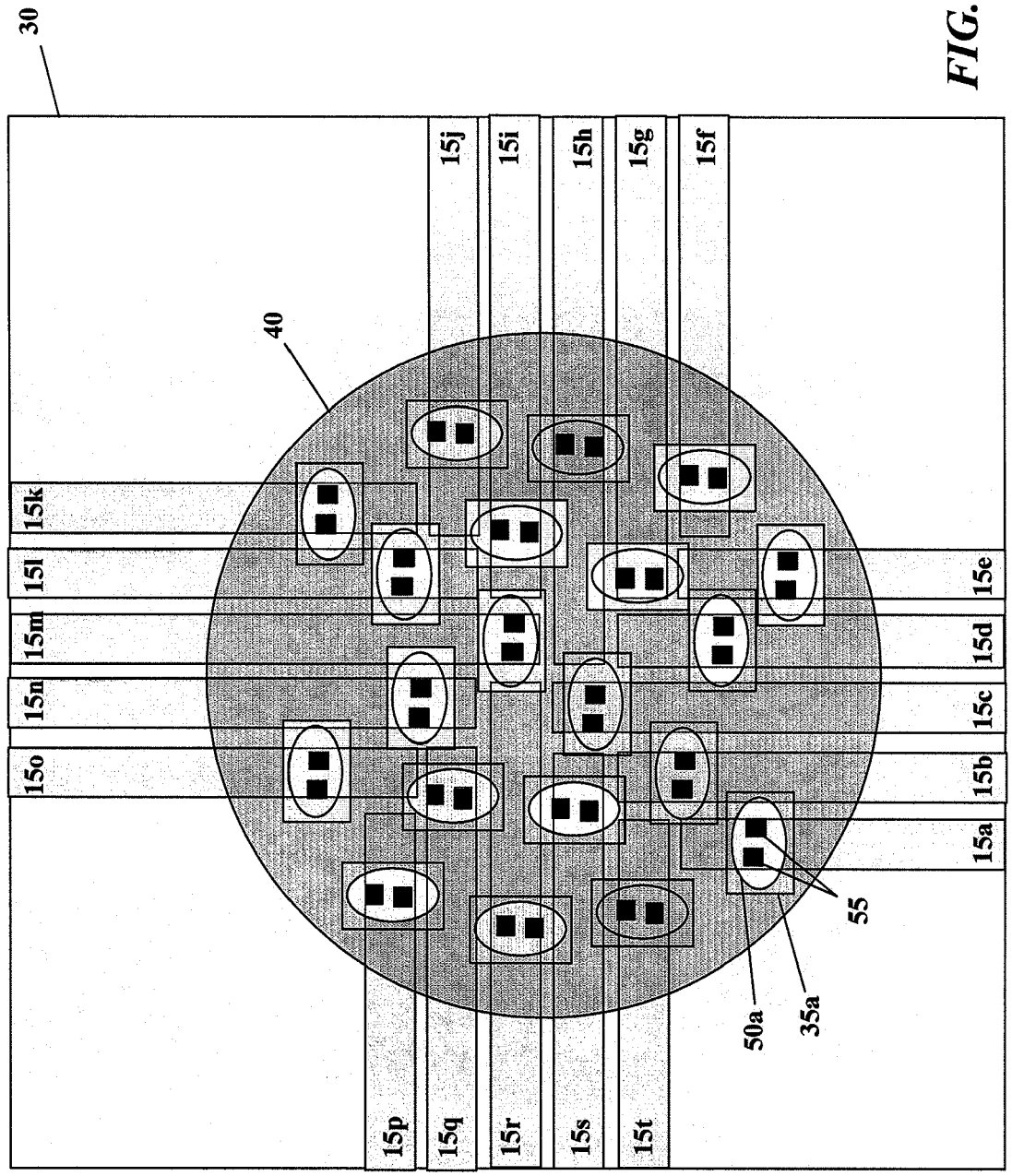

FIG. 7 shows a top-down schematic view of a structure according to aspects of the invention, in which like reference numbers represent similar features. For example, the structure depicted in FIG. 7 comprises a PSPI layer 30, a BLM layer 40, and wires 15a-t. Each wire is associated with a respective aluminum pad segment, a respective final via, and two peripheral vias. For example, wire 15a is connected to peripheral vias 55, which are connected to a pad segment 35a, which is connected to the BLM layer 40, which is connected a final via 50a, which is connected to the solder bump (not shown). In this manner, each wire (e.g., 15a-t) provides a discrete path for current to flow between the circuit (of the chip) and the solder bump. As such, the current density in any one area is reduced proportionally to the number of separate paths. Accordingly, electromigration performance of the chip is improved. Although twenty wire segments are depicted as connected to a single solder bump in FIG. 7, the invention is not limited to this number of wires, and any number of wires arranged in any desired pattern may be used with aspects of the invention.

Figure 8:
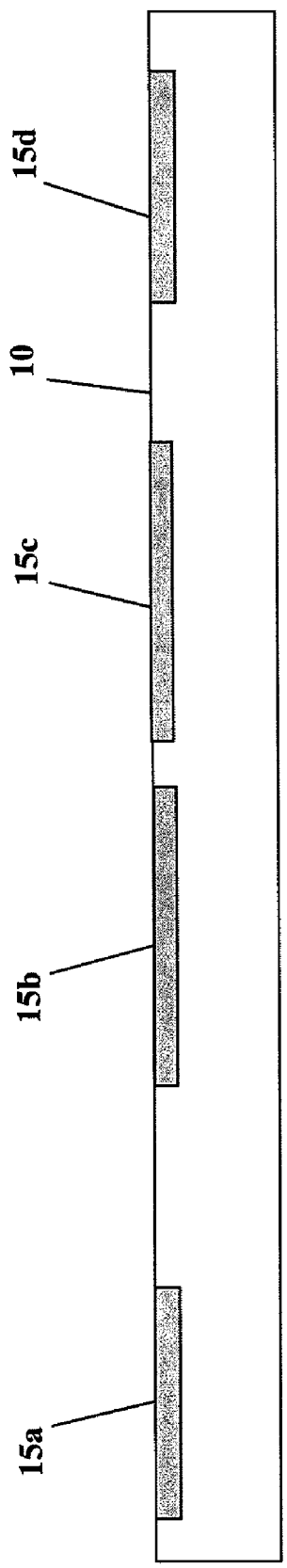
FIGS. 8-13 show intermediate structures and respective processing steps in accordance with aspects of the invention.
Figure 9:
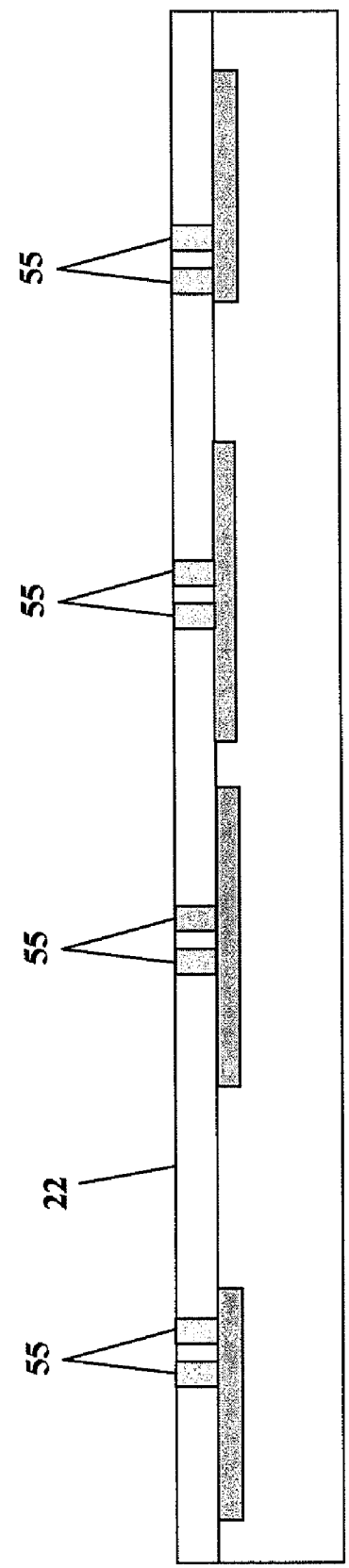

FIGS. 8-13 show intermediate structures and respective processing steps in accordance with aspects of the invention. Specifically, FIG. 8 shows an upper level wiring layer 10 and wires 15a-d, which may be formed using conventional BEOL techniques. FIG. 9 shows dielectric film 22 formed over wiring layer 10, and peripheral vias 55 formed in the dielectric film 22. The peripheral vias 55 may be formed in the film 22 using conventional techniques, such as, for example, photolithographic masking, reactive ion etching (RIE), and metal deposition.

Figure 10:
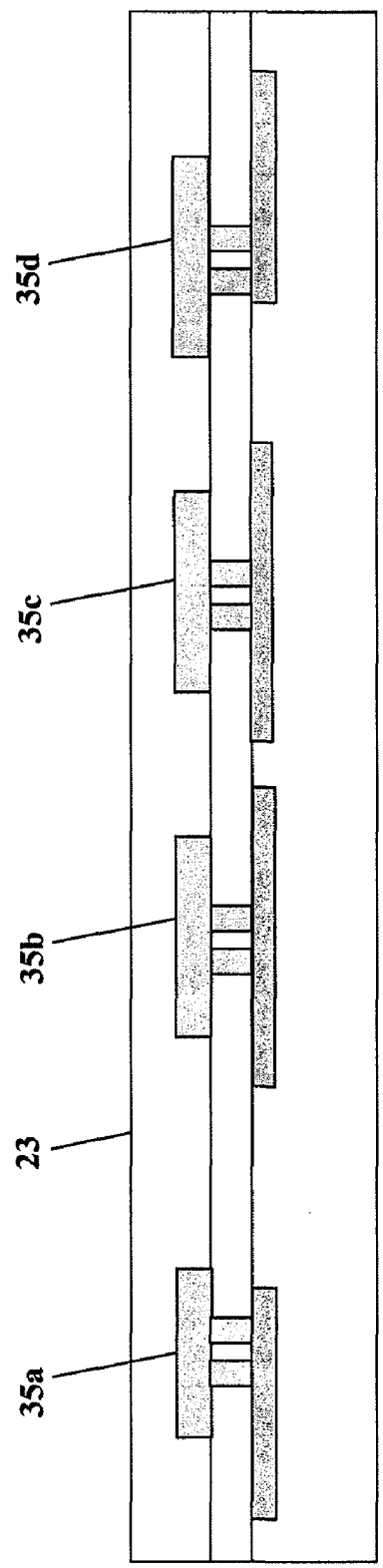
Figure 11:
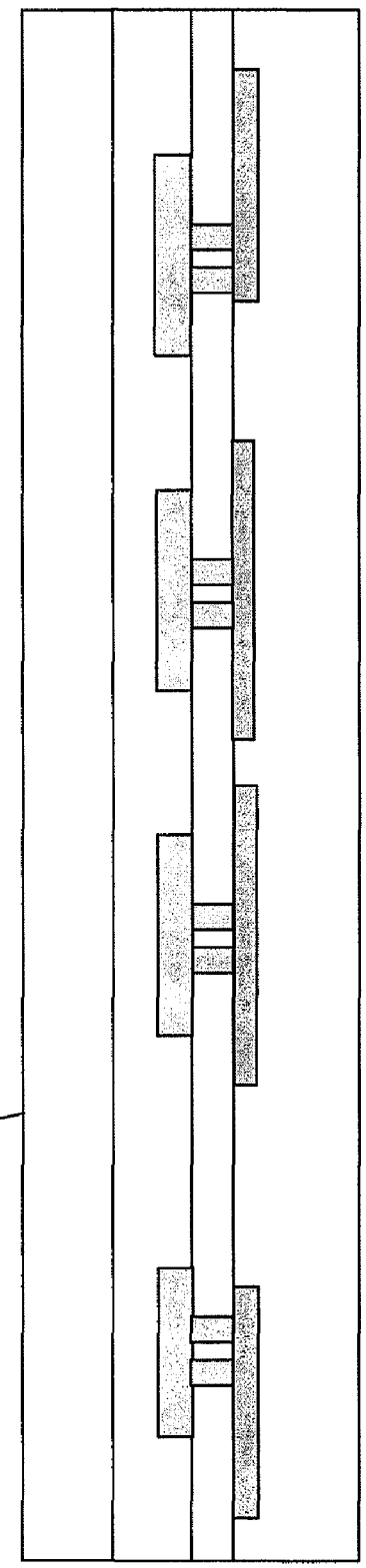
Figure 12:
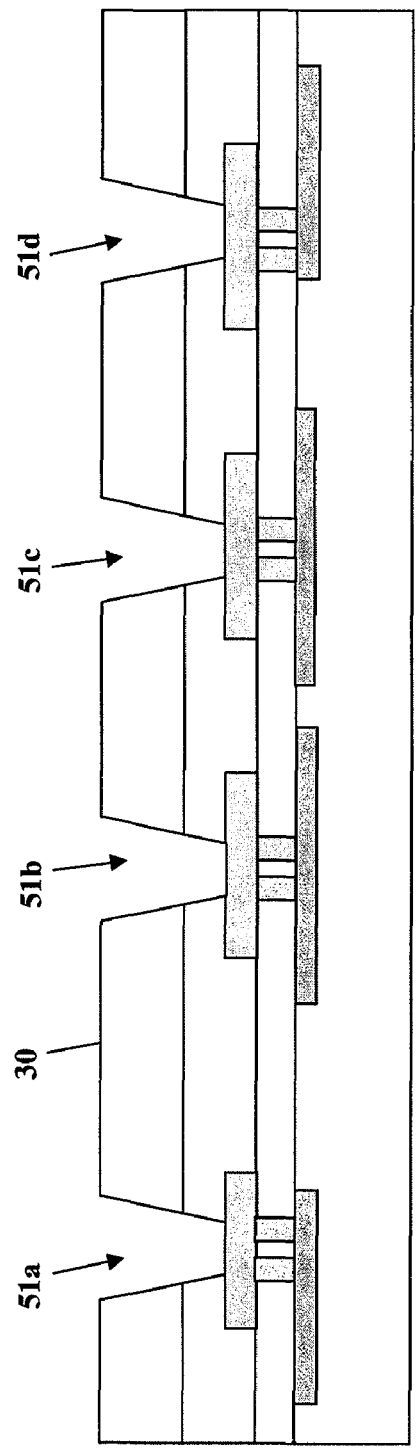

As depicted in FIG. 10, pad segments 35a-d are formed over and in contact with the peripheral vias 55, and upper dielectric film 23 is formed on all of the exposed upper surfaces. In FIG. 11, PSPI layer 30 is formed over the upper dielectric film 23. In FIG. 12, final via openings 51a-d are formed in the PSPI layer 30 and the upper dielectric film 23. The final via openings 51a-d extend down to the upper surface of the pad segments 35a-d.

Figure 13:
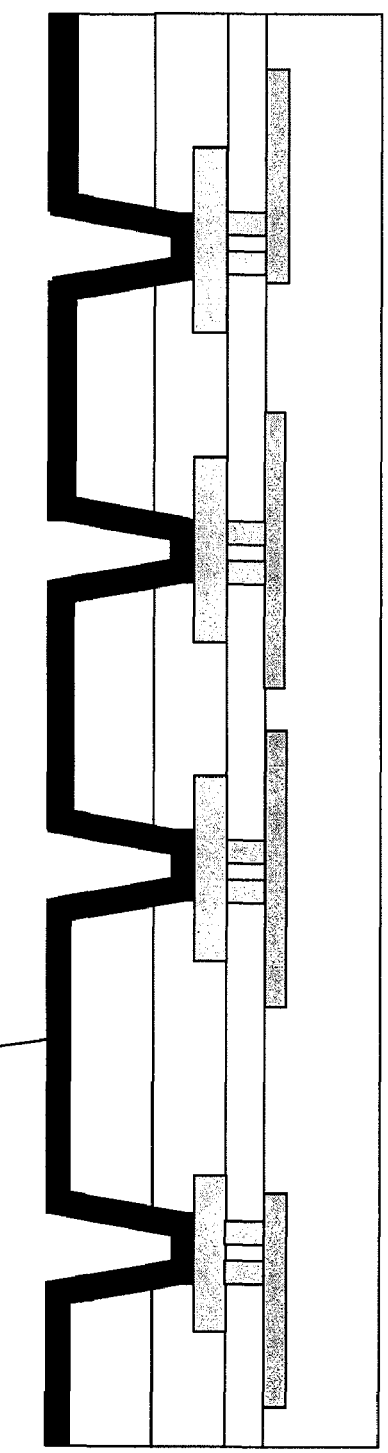

As shown in FIG. 13, the BLM layer 40 is formed on the exposed surfaces of the PSPI layer 30, upper dielectric film 23, and pad segments 35a-d. The BLM layer 40 may be formed using conventional techniques, such as, for example, deposition process. A solder bump (not shown) may be formed on the structure of FIG. 13 to result in the structure shown in FIG. 5.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A semiconductor structure, comprising:
   a wire comprising first and second wire segments;
   a first dielectric film over and contacting the first and second wire segments;
   a second dielectric film over and contacting the first dielectric film;
   a passivation layer over and contacting the second dielectric film;
   a pad formed over the wire, wherein an uppermost surface of the second dielectric film is higher than an uppermost surface of the pad;
   a ball limiting metallization (BLM) layer formed over the pad;
   a solder bump formed over the BLM layer;
   a terminal via formed over the BLM layer; and
   at least one peripheral via formed between the second wire segment and the pad, wherein the first and second wire segments are discrete wire segments.

2. The semiconductor structure of claim 1, wherein the first wire segment and the terminal via are centrally located with respect to the solder bump.

3. The semiconductor structure of claim 2, further comprising a final via formed over the terminal via, wherein the final via is wider than the terminal via.

4. The semiconductor structure of claim 1, wherein:
the wire further comprises a third wire segment, and
the semiconductor structure further comprises at least one other peripheral via formed between the third wire segment and the pad.

5. The semiconductor structure of claim 4, wherein the first, second, and third wire segments are separated from one another by dielectric material in an upper wiring level.

6. The semiconductor structure of claim 1, wherein:
the pad is in direct contact with the first wire segment, and
the first dielectric film separates the pad from the second wire segment.

7. The semiconductor structure of claim 6, wherein the at least one peripheral via is formed in the first dielectric film.

8. The semiconductor structure of claim 1, wherein the solder bump comprises lead-free material.

9. The semiconductor structure of claim 1, wherein the at least one peripheral via comprises two peripheral vias each forming a discrete electrical contact between the pad and the second wire segment.

10. A semiconductor structure, comprising:
a plurality of stacks between an upper wiring level and a solder bump, each one of the plurality of stacks comprising a wire segment in the upper wiring level, at least one peripheral via in a first dielectric film, the at least one peripheral via over and contacting the wire segment, a pad segment in a second dielectric film and contacting the at least one peripheral via, and a terminal via extending into the second dielectric film,
wherein each one of the plurality of stacks constitutes a discrete electrically conductive path between the upper wiring level and the solder bump to reduce current density.

11. The semiconductor structure of claim 10, wherein in each one of the plurality of stacks, the at least one peripheral via is between the wire segment and the pad segment.

12. The semiconductor structure of claim 11, wherein the at least one peripheral via comprises two peripheral vias formed in a dielectric film between the wire segment and the pad segment.

13. The semiconductor structure of claim 10, wherein each one of the plurality of stacks comprises a portion of a ball limiting metallization (BLM) layer between the pad segment and the terminal via.

14. The semiconductor structure of claim 13, wherein the BLM layer is formed on surfaces of a passivation layer and the second dielectric film.

15. The semiconductor structure of claim 10, wherein in each one of the plurality of stacks, the terminal via is larger than the at least one peripheral via.

16. The semiconductor structure of claim 10, wherein the solder bump is a lead-free solder bump.

17. The semiconductor structure of claim 10, wherein the plurality of stacks comprise four stacks.

18. A method for forming a semiconductor device, comprising:
forming a first wire segment and a second wire segment in a wiring level, wherein the first and second wire segments are discrete wire segments;
forming a first dielectric film on the first and second wire segments and wiring level;
forming at least one peripheral via in the first dielectric film and over the second wire segment;
forming a pad on the first dielectric film and contacting the first wire segment and the at least one peripheral via;
forming a second dielectric film on the first dielectric film and on an uppermost surface of the pad;
forming a passivation layer on the second dielectric film; and
forming a ball limiting metallization (BLM) layer, a terminal via, a final via, and a solder bump in electrical communication with the pad.

19. The method of claim 18, wherein:
the first wire segment, the terminal via, and the final via are centrally located with respect to the solder bump, and
the final via is larger than the terminal via.

20. A method of forming a semiconductor structure, comprising:
forming at least two discrete wire segments in a wiring level;
forming a first dielectric film over the at least two discrete wire segments and the wiring level;
forming peripheral vias in the first dielectric film, the peripheral vias being over and contacting the at least two discrete wire segments;
forming a second dielectric film on the first dielectric film;
forming at least two discrete pad segments in the second dielectric film, the at least two discrete pad segments being over and contacting the peripheral vias;
forming a passivation layer over the second dielectric film;
forming at least two terminal via openings in the passivation layer and into the second dielectric film;
forming a ball limiting metallization (BLM) layer on exposed surfaces; and
forming a solder bump on the BLM layer.

21. The semiconductor structure of claim 1, further comprising a third dielectric film and a final via, wherein:
the third dielectric film is over and contacting the second dielectric film; and
the final via is over and contacting the terminal via,
the final via is wider than the terminal via;
the final via extends through the third dielectric film and the second dielectric film;
a portion of the pad comprises a layer of conductive material between the first dielectric film and the second dielectric film; and
a lowermost portion of the BLM layer is lower than a level of an interface between the first dielectric film and the second dielectric film.

22. The semiconductor structure of claim 10, further comprising a third dielectric film and a ball limiting metallization (BLM) layer, wherein:
the first dielectric film comprises oxide formed directly on the upper wiring level;
the second dielectric film comprises nitride formed directly on the first dielectric film;
the third dielectric film comprises photosensitive polyimide formed directly on the second dielectric film;
the BLM layer is formed directly on the third dielectric film, portions of the second dielectric film, and the pad segments;
the respective wire segments of the plurality of stacks are separated from each other by dielectric material of the upper wiring level; and
each one of the respective wire segments of the plurality of stacks is connected to only a single one of the respective pad segments.

\* \* \* \* \*